United States Patent [19]

Tasset

[11] Patent Number: 4,530,601

[45] Date of Patent: Jul. 23, 1985

[54] QUANTITATIVE TEST FOR RESIDUAL ROSIN ON CLEANED CIRCUIT BOARDS

[75] Inventor: Emmett L. Tasset, Lake Jackson, Tex.

[73] Assignee: The Dow Chemical Company, Midland, Mich.

[21] Appl. No.: 544,346

[22] Filed: Oct. 24, 1983

[51] Int. Cl.³ .................. C09K 3/00; G01N 21/32; G01N 1/00
[52] U.S. Cl. .................. 356/36; 356/237; 252/408.1; 436/85; 436/1
[58] Field of Search .......... 29/593, 404, 588, 574; 134/10, 26, 38, 40; 324/72, 73 PC; 264/272.2, 272.11, 272.12, 272.13, 272.19, 272.21; 252/408.1; 436/1, 60, 85; 356/441, 442, 36, 237

[56] References Cited

U.S. PATENT DOCUMENTS

| | | | |
|---|---|---|---|
| 3,766,639 | 10/1973 | Parr | 252/408.1 |
| 3,957,531 | 5/1976 | Tipping | 134/11 |
| 4,023,984 | 5/1977 | Clementson | 134/38 |
| 4,052,328 | 10/1977 | Figiel | 252/171 |
| 4,062,794 | 12/1977 | Figiel | 252/171 |
| 4,070,299 | 1/1978 | Reusser | 252/171 |

*Primary Examiner*—Edward A. Miller
*Assistant Examiner*—Catherine S. Kilby
*Attorney, Agent, or Firm*—G. R. Baker

[57] ABSTRACT

A procedure is described whereby it can be determined to what extent the non-ionic constituents of a rosin flux, employed during soldering operations in the manufacture of electronic circuit boards, have been removed following the flux removal step. The procedure also permits conductivity readings to be made on the test solution to determine the extent of residual ionic constituents on such boards.

6 Claims, No Drawings

QUANTITATIVE TEST FOR RESIDUAL ROSIN ON CLEANED CIRCUIT BOARDS

BACKGROUND OF THE INVENTION

It is well known in the electronic circuit board industry that it is necessary to remove the residue of the solder flux applied prior to the soldering operation during the manufacture of circuit boards. There are several proprietary solvent compositions employed by the industry to effectuate the removal of the flux. However, the removal of the residual flux is not a constant in the mechanized cleaning process and therefore tests have been devised to determine the effectiveness of the solvents used in the process to remove the flux residue. It is common to measure the conductivity of an alcohol-water test wash solution to determine the extent of the ionic constituents remaining on the boards after defluxing and, in the research laboratories, either infrared spectrophotometric analysis for qualitative analysis of the non-ionic constituents or high performance liquid chromatography to obtain quantitative analysis. The latter is a very expensive and complicated procedure due to the high cost of the analytical equipment necessary to carry out the test and the complicated procedure to be followed to insure the results are meaningful.

Therefore, it would be advantageous to the industry to have a relatively accurate yet simple test which can determine the extent of non-ionic constituents remaining on a board after cleaning to remove the flux.

BRIEF DESCRIPTION OF THE INVENTION

In accordance with the present invention the non-ionic and, if desired, the ionic constituents of a rosin solder flux remaining on an electronic circuit board after it has been cleaned with a proprietary flux removal solvent can be determined by washing each side of a circuit board with at least one (1) milliliter of either isopropyl alcohol or acetonitrile per square inch of area of a side, collecting the washings and, using a 2 to 10 ml aliquot of the wash, either (a) add sufficient aqueous 0.05 to 1 N acid solution to make a 5 to 20 percent solution of the washings in the aqueous acid and provide a solution having a pH between about 1 and about 3, or (b) concentrate the washings to dryness and add back to the dry residue sufficient isopropanol or acetonitrile, sufficient 0.05 to 1 N aqueous acid solution to make a 5–20 percent by volume solution of the washings in the aqueous acid solution and to provide a solution having a pH between about 1 and about 3, to enable readings to be made by the selected turbidity measuring instrument, and measure the turbidity within 30 minutes of the time the solutions are prepared and compare the reading to a graphic standard prepared from turbidity readings taken of known quantities of the flux residues prepared in the above manner.

It is to be understood that the concentrate technique is to be employed when detection of below about 20 micrograms of non-ionic residue constituents per square centimeter of area are present.

If levels of non-ionic residue below 1 $\mu$g/cm$^2$ are required to be detected the concentrate procedure is followed except larger aliquot volumes of the washings are evaporated to dryness or smaller volumes of the solvent and thus less acid solution are added back to the dried residue.

In addition, if it is desirable to obtain a measure of the ionic residue of the flux retained on the boards by the conductivity test, an aqueous wash solution containing about 75% solvent/25% water may be substituted for the substantially neat solvent aforedescribed and conductivity readings taken prior to addition of the acid. it is understood that the acid is added in a quantity to produce the 50–90% by volume of acid to yield a solution having a pH between about 1 to about 3 and 50–10% by volume of the solvent (isopropanol or acetonitrile) before the turbidity test described is employed. Of course, an alcohol/water wash solution can be evaporated to dryness and thereafter the turbidity test run in the manner aforedescribed using the steps to the concentrate technique.

DETAILED DESCRIPTION OF THE INVENTION

A representative method of conducting the test is as follows:

1. Measure circuit board to find the area on one side (e.g., 2″×5″=10 in$^2$);

2. with a clean tweezer, place the circuit board at a 60° angle above a funnel which drips into a graduated volumetic cylinder (25, 50 or 100 ml cylinder as needed);

3. wash one side of the board with at least 1 ml isopropanol/in$^2$ then turn the board over and again wash with at least 1 ml isopropanol/in$^2$ (e.g. 10 in$^2$ board washed with minimum of 20 ml isopropanol total). Use a 10 to 25 ml syringe to measure the appropriate wash volumes;

4. measure the volume of isopropanol collected in the volumetric cylinder which should be 2 times the area in inches of one side of the board. If it is short due to hold-up on the board, measure the additional volume needed and wash the board again on both sides until the proper volume is obtained.

The sample collected is then treated according to procedure A or B exemplified below

A. Unconcentrated Method (10 $\mu$g/cm$^2$ to 100 $\mu$g/cm$^2$ detection level)

Using a 2 ml syringe, place 2 ml of wash into a 50 ml developing flask and add 18 ml of 0.1 N HCl with a 20 ml syringe. Stopper the flask, invert three times and allow to stand 20 minutes before obtaining a turbidity reading on a spectrometer.

B. Concentrated Method (2 $\mu$g/cm$^2$ to 20 $\mu$g/cm$^2$ detection level)

Step 1. Using a 20 syringe, place 8 ml into a 50 ml vacuum boiling flask, apply a vacuum to the flask and place it on a steam bath while agitating and evaporate to dryness.

Step 2. After evaporating to dryness, add 2 ml of isopropanol into the flask to redissolve the residue and agitate one minute. Using a 20 ml syringe, add 18 ml of 0.1 N HCl, stopper, invert three times and allow to stand 20 minutes before obtaining a reading on the spectrometer.

A 10% isopropanol in 0.1 N HC; blank is prepared and placed in the spectrometer set at the lowest absorbance, obtained by adjusting the wavelength to approximately 520 nm, at which a reading can be made and the instrument set at zero. A sample can now be placed in the cuvette and a reading obtained. The reading is compared to a standardized graph prepared from readings taken using various concentrations of the flux in a similar quantity of the solvent/aqueous acid solution.

EXAMPLE

Two 1" by 2" rosin board coupons were fluxed with Alpha 711-35 MIL then reflowed at 240° C. for 15 seconds. The coupons were put through a cleaning cycle using a proprietary methylchloroform-alcohol blend as the reflux removal agent. The cleaned coupons were then sprayed with 8 ml of isopropanol. The washings were concentrated to dryness and 2 ml of isopropanol was added back plus 18 ml of 0.1 N HCl. After 20 minutes, the absorbance (turbidity) was read on a spectrometer at 520 nm wavelength, giving a value of 0.387. This value corresponds to 470 ppm solids in solution when compared to a standardized graph prepared from the data in the following Table and is calculated to give 14 micrograms/cm² of board surface.

TABLE

DEVELOPMENT OF STANDARD BASED ON
PPM 711-35 MIL SOLIDS IN
ISOPROPANOL/ACID SOLUTION

| | ppm by wt 711-35 MIL solids in isopropanol solution | | | | |
|---|---|---|---|---|---|
| | 50 | 100 | 200 | 500 | 750 |
| Calculated Method A $\mu g/cm^2$ for 1 ml/in² wash | 6.1 | 12 | 30 | 61 | 91 |
| Calculated Method B (factor of 4) $\mu g/cm^2$ for 0.25 ml/in² solution | 1.5 | 3.0 | 7.6 | 15 | 23 |
| Absorbance[1] | 0.030 | 0.045 | 0.170 | 0.420 | 0.655 |

Representative calculations to obtain $\mu g/cm^2$ based on turbidity observations:

Method A 50 ppm =

$$\frac{50 \ \mu g}{1 \text{ g solution}} \times 0.7808^* \text{g/ml} \times \frac{1 \text{ ml}}{\text{in}^2} \times \frac{1 \text{ in}^2}{6.45 \text{ cm}^2} = 6.05$$

Method B

TABLE-continued
DEVELOPMENT OF STANDARD BASED ON
PPM 711-35 MIL SOLIDS IN
ISOPROPANOL/ACID SOLUTION 50 ppm =

$$\frac{50 \ \mu g}{1 \text{ g solution}} \times 0.7808 \text{ g/ml} \times \frac{1 \text{ ml}}{\text{in}^2} \times \frac{1 \text{ in}^2}{6.45 \text{ cm}^2} \div 4 = 1.5$$

[1]Values measured at 20 minutes against a 10% isopropanol/90% 0.1 N HCl blank.
*0.7808 is the density of isopropyl alcohol.

I claim:

1. A method for determining the cleanliness of an electronics circuit board following solder flux removal procedures which comprises washing both major surfaces of said board with a measured quantity of a test solvent selected from the group consisting of isopropanol, acetonitrile, or an aqueous solution thereof containing greater than 50% by volume of one of said solvents, said board previously having been washed with a rosin flux removal composition to remove said flux after soldering the circuitry of said board, said measured quantity being at least about 1 milliliter of said test solvent per square inch of board surface, excluding edges,
   collecting said washings,
   adjusting the pH of an aliquot of said washings to between about 1 to about 3 with an aqueous 0.05 to 1N aqueous acid solution,
   agitating gently said mixture,
   measuring the turbidity of the resulting solution, and comparing to a standard.

2. The method of claim 1 wherein said acid is hydrochloric acid.

3. The method of claim 2 wherein said test solvent is isopropanol.

4. The method of claim 1 wherein said collected washings are evaporated to dryness and sufficient test solvent is admixed with the dry residue to dissolve said residue prior to addition of the acid.

5. The method of claim 1 wherein said test solvent is an aqueous solution of isopropanol, and prior to addition of the acid, the washings are subjected to a test for conductivity/resistivity to determine the ionic component of content of said washings.

6. The method of claim 1 wherein said aqueous solution is 75/25 isopropanol/water solution.

* * * * *